United States Patent [19]
Sogard

[11] Patent Number: 5,954,982
[45] Date of Patent: Sep. 21, 1999

[54] METHOD AND APPARATUS FOR EFFICIENTLY HEATING SEMICONDUCTOR WAFERS OR RETICLES

[75] Inventor: Michael R. Sogard, Menlo Park, Calif.

[73] Assignee: Nikon Corporation, Japan

[21] Appl. No.: 08/800,896

[22] Filed: Feb. 12, 1997

[51] Int. Cl.⁶ .............................. H05B 1/02; H01L 21/20
[52] U.S. Cl. ..................... 219/502; 219/483; 219/494; 118/725; 392/416
[58] Field of Search .................... 219/483–486, 219/502, 505, 411–414, 494; 156/345; 118/641, 724, 725; 392/416, 418

[56] References Cited

U.S. PATENT DOCUMENTS

| | | | |
|---|---|---|---|
| 2,924,695 | 2/1960 | Atkeson | 392/416 |
| 4,433,246 | 2/1984 | Muka et al. | 250/492.1 |
| 4,468,259 | 8/1984 | Mimura | 148/1.5 |
| 4,469,529 | 9/1984 | Mimura | 148/1.5 |
| 4,486,652 | 12/1984 | Muka et al. | 219/553 |
| 4,503,087 | 3/1985 | Russo | 427/55 |
| 4,550,684 | 11/1985 | Mahawili | 118/724 |
| 4,622,447 | 11/1986 | Inoue | 219/10.55 R |
| 4,794,217 | 12/1988 | Quan et al. | 437/247 |
| 5,036,179 | 7/1991 | Westerberg et al. | 219/411 |
| 5,256,341 | 10/1993 | Denis et al. | 264/25 |
| 5,313,044 | 5/1994 | Massoud et al. | 219/121.85 |
| 5,377,298 | 12/1994 | Yang | 392/360 |
| 5,707,500 | 1/1998 | Shimamura et al. | 204/298.03 |

*Primary Examiner*—Mark H. Paschall
*Attorney, Agent, or Firm*—Skjerven, Morrill, MacPherson, Franklin & Friel LLP; Norman R. Klivans

[57] ABSTRACT

A method and apparatus for efficiently heating for instance a semiconductor wafer or reticle substrate in either vacuum or air, by exposing the wafer or reticle to radiation whose spectrum is such that it includes only wavelengths which have been determined to be efficiently absorbed by the material of the wafer or reticle. This advantageously allows more rapid and uniform heating than is allowed by prior art broadband radiation, convection heating, or conduction. The wavelength and bandwidth of the radiation are selected to be those wavelengths efficiently absorbed by the wafer or reticle, depending on its particular material and thickness. Typical applications are to a wafer or reticle located in a vacuum where convection or conduction heating are inconvenient or absent.

15 Claims, 4 Drawing Sheets

METHOD AND APPARATUS FOR EFFICIENTLY HEATING SEMICONDUCTOR WAFERS OR RETICLES

BACKGROUND OF THE INVENTION

This invention relates to heating methods and more specifically to efficiently heating for instance a semiconductor wafer or a reticle (mask) in vacuum, air or other gas.

DESCRIPTION OF THE PRIOR ART

A well known problem in manufacturing, especially for semiconductor fabrication, is the need to heat a substrate such as a silicon crystal wafer (semiconductor wafer) or a quartz reticle substrate (mask) to a constant uniform controlled temperature rapidly and efficiently.

It is well known in the semiconductor field to heat a semiconductor-wafer by radiation using a black body radiator outputting a constant planar energy flux placed in opposition to the semiconductor material. The black body source thereby uniformly heats the semiconductor material. See for instance Muka et al. U.S. Pat. No. 4,486,652 issued Dec. 4, 1984. It is also well known to heat semiconductor wafers by conduction i.e., by placing the wafer directly on a heated surface. It is also well known (in air) to heat a wafer by convection, i.e. supplying a stream of warmed air (or other gas) passing over the wafer.

These prior methods are suitable in some circumstances; however, they have significant drawbacks.

For instance, it is often necessary to heat a wafer or a reticle in a vacuum. This is especially true for electron beam lithography applications where, for instance a reticle substrate which is to be fabricated into a mask is heated in an ante-chamber before being placed in the actual vacuum chamber for processing. In such "E-beam" technology, temperature control is especially important. Typically in this case the reticle cools down during the pump down stage in the ante-chamber due to adiabatic effects. While the reticle must be heated in the vacuum to restore its temperature, convection is of course not available. Also in the vacuum environment a vacuum chuck is not operative and hence the reticle contact to the chuck may not be sufficient for adequate conductive heating via the chuck. The same problems apply to wafers in E-Beam lithography. If an electrostatic chuck is used to maintain intimate contact with a wafer in a vacuum, typically the substrate which is the upper portion of the chuck on which the wafer sits must be a dielectric and hence its thermal conductivity is likely to be low, inhibiting conductive heating.

Hence where heating is necessary in a vacuum, the conductive and convective heating methods are less effective or not available. Precise temperature control is important in these applications, because if the wafer temperature differs from that of its surroundings, the wafer temperature will change and its resulting thermal expansion or contraction degrades the precision of the lithography or metrology. Thus in these applications, radiative heating tends to be the dominant heat transfer mechanism.

In any case, conduction and convection efficiencies are a function of the temperature difference between the wafer and the heat source or the ambient surroundings. For small temperature differences, the heat transfer efficiency is proportional to the temperature difference. For the case of conduction or convection, accurate control of the wafer or reticle temperature-, as well as the temperature uniformity, requires a relatively small difference between the wafer or reticle temperature and the temperature of the heat source. Hence for small differences in temperature the efficiency of heat transfer tends to be low and heating the wafer to the desired temperature can take excessive amounts of time, increasing cost by decreasing manufacturing throughput.

Another limitation of conduction and convection heating is that the heating is a surface phenomenon; the surface of the wafer or reticle is heated, and this heat is transferred with some delay into the heated body's interior by internal conduction. This heat transfer is probably satisfactory for a silicon wafer, but it is a significant problem e.g. for recticles made of quartz, which has a low thermal conductivity.

For the case of radiative heating by a blackbody radiator, larger temperature differences may be used. However, the radiation spectrum is so broad that much of the radiation will be reflected from the workpiece or transmitted through it.

Also, much of the spectrum of radiation which is absorbed is absorbed so strongly that much of the heating is essentially surface heating, so the effect is similar to that of convection or conduction heating.

Furthermore, a black body radiator will also heat up the wafer chuck or support and any other structures present in the chamber capable-of absorbing any of the wavelengths of the broadband black body spectrum. This further complicates heating control by inducing non-uniform heating of the workpiece, since a portion of the workpiece in direct contact with the wafer chuck may undesirably be heated more than other portions of the wafer.

Another application where wafer heating is important is in the context of semiconductor wafers coated with chemically amplified resists (CAR) which must be heated uniformly and rapidly to within a precise temperature range. This is also difficult with prior art heating-sources.

Thus there is a clear need for improved heating methods, and especially those applicable to the vacuum environment but not so limited, for use in heating a semiconductor wafer or reticle.

SUMMARY

In accordance with the present invention, a workpiece (e.g. semiconductor wafer or reticle substrate) is efficiently heated either in vacuum or air by exposing the workpiece to radiation whose spectrum is controlled to include only those wavelengths which have been determined to be efficiently absorbed by the particular workpiece. This advantageously allows more rapid and more uniform heating than by prior art radiation techniques or by convection or by conduction. A typical application is to heat wafers in vacuum for E-beam lithography so as to overcome the above-described problem of cooling during vacuum pumpdown in an ante-chamber. Another application is when a reticle is fabricated in vacuum by E-beam lithography, where the temperature of the reticle must be controlled to be the same as the vacuum chamber ambient temperature. Also as mentioned above, for wafers coated with CAR, uniform and rapid wafer heating is essential.

In accordance with the present invention, rapid heating is possible since the energy transfer efficiency to the workpiece is not dependent on the temperature difference between the source and the workpiece. Also the heating is uniform since little heat is absorbed by the support for the workpiece or by the chamber, provided the workpiece supports and the chamber's material properties are properly chosen. The prior art problem of conduction, convection and radiative transfer using broadband radiation wherein efficiency is proportional to the temperature difference between the workpiece and the radiator is thereby avoided.

Thus, for example in accordance with the present invention a silicon crystal wafer is irradiated with light having a narrow bandwidth (e.g. of only several nanometers) and a central wavelength e.g. of slightly greater than 1 micrometer ($\mu$m). This has been determined to be a bandwidth efficiently absorbed by silicon material having the typical thickness of a silicon semiconductor wafer, i.e. 725 micrometers for an 8 inch diameter wafer.

Thus the bandwidth of incident radiation used for heating in accordance with the present invention is determined by an analysis of the absorption coefficient of the workpiece material at various wavelengths and the thickness of the workpiece. This determination can be accomplished by theoretical calculation or experimentation. Thus this method is suitable not only for "virgin" semiconductor wafers or quartz substrates, but also for wafers which have been partially processed, thereby having integrated circuit layers formed thereon. In this case the radiation is typically applied from the wafer backside naked surface to optimize radiation absorption by the wafer.

The radiation source may be, for example, a narrow band radiator, such as a laser or laser diode of the proper wavelength, or alternatively a broadband light source which is subject to bandpass filtering. The workpiece to be heated may be placed on a transparent support (transparent to the incident radiation) with the incident radiation thereby passing through the support for backside heating. Typically a temperature sensor is applied to the workpiece to determine its temperature while it is being heated, with feedback temperature control provided to the source.

Advantageously, and in accordance with this invention, the irradiated energy is absorbed by the workpiece independent of the temperature of the workpiece. Therefore the temperature of the workpiece can be controlled both rapidly and precisely to a fixed value.

DETAILED DESCRIPTION

Figure 1:
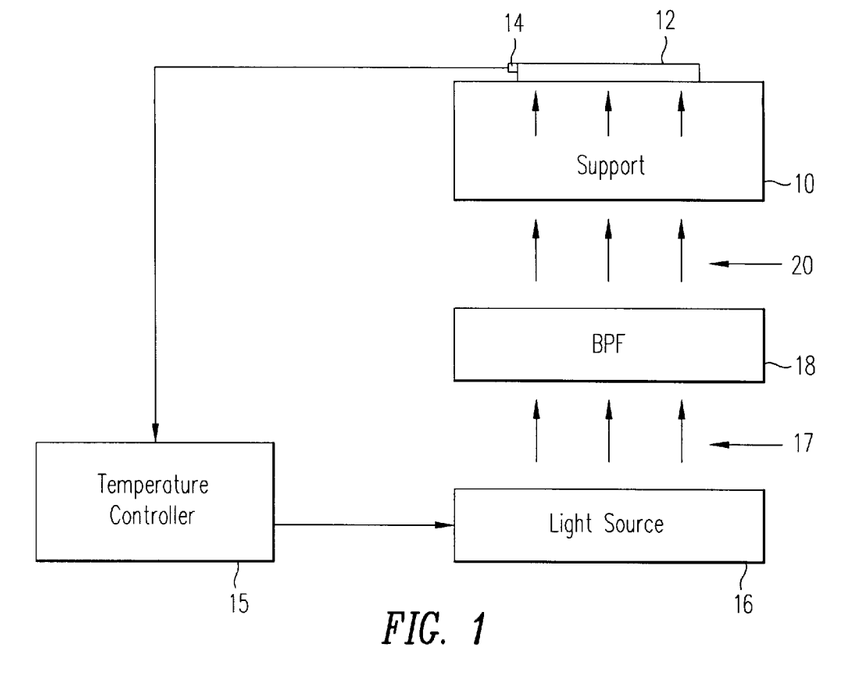
FIG. 1 shows diagrammatically an apparatus in accordance with the present invention for heating a workpiece (semiconductor wafer or mask).

An exemplary heating system in accordance with the present invention is shown diagrammatically in side view in FIG. 1, It is to be understood that conventional mechanical support structures are omitted from the drawing for simplicity and this drawing is not to scale, but illustrates a general heating apparatus in accordance with the present invention. One of ordinary skill in the art will readily understand how to mount the various components and provide the needed electrical power and control cabling. This apparatus may be operated in air, in another gas inside a chamber, or in a vacuum chamber.

In this particular embodiment a support 10 which is of adequate size to support the workpiece 12, for instance a reticle or semiconductor wafer of the desired size, is mounted so as to hold the workpiece 12. In this case the workpiece merely rests on the support 10. In another embodiment the support 10 is a vacuum chuck (if this apparatus is not in a vacuum chamber) or an electrostatic chuck. Note that, if heating from below, the chuck must be transparent to the radiation. Alternatively, support 10 is a mesh of e.g. nylon which is transparent to the heating radiation.

A temperature sensor 14 is associated with the workpiece 12. Sensor 14 may be a contact temperature sensor, for instance a thermocouple type sensor. Temperature sensor 14 is connected to a conventional temperature controller 15, which may include, for example, a thermostatic controller, which in turn provides either a manual indication of the temperature of the workpiece or may be connected by an automatic thermostatic control system to regulate the power output of light source 16. Since heating of the wafer is uniform herein, even though sensor 14 is only in contact with or observing a portion of the workpiece, it gives an accurate temperature reading independent of its location.

In this case radiation source 16 is a broadband light source, for instance a quartz-halogen lamp for heating a silicon crystal workpiece 12. The radiation output by source 16 (indicated by arrows 17) is subject to a bandpass filter 18 so that the only radiation (indicated by arrows 20) which passes through the transparent support 10 and is incident upon wafer 10 is within a narrowly defined bandwidth having a particular central frequency which is that determined to be efficiently absorbed by the particular workpiece in question. Suitable optical bandpass filters are known to those skilled in the optics art.

In one embodiment filter 18 is positioned to eliminate broadband radiation from source 16 which could interfere with the chamber environment, causing undesirable temperature non-uniformities which could affect the wafer (workpiece).

It is to be understood that alternatively instead of using a broadband radiation source 16 with a bandpass filter 18, a narrow band radiation source may be used, for instance a laser diode or laser. For example, a NdYAG solid state laser has a wavelength of 1.064 $\mu$m. As shown later, approximately half of the light of that wavelength entering a 725 $\mu$m thick silicon wafer is absorbed in one pass. Thus this wavelength is nearly ideal. The NdYAG laser is a common, efficient and reliable laser.

The amount of radiation power required for heating can be estimated as follows. Let I=radiation intensity, and suppose a fraction f of the radiation is absorbed by the wafer. The time rate of temperature change dT/dt of the wafer is given approximately as follows (ignoring any radiation of the wafer to its surroundings):

$$dT/dt = fI/c_p t\rho,$$

where $c_p$ is the specific heat of silicon, t is the wafer thickness, and $\rho$ is the density of silicon. Suppose I=5 mW/cm$^2$, cp=0.7 J/g–°C., $\rho$=2.33 g/cm$^3$, and t=0.0725 cm. If f=1.0, then the above equation shows that the wafer temperature increases by 1° C. in about 24 sec., a reasonably short time. If f=0.5, this time would increase by a-factor of two. An 8 inch diameter wafer has a surface area of approximately 324 cm$^2$. Therefore the total laser power required to irradiate the entire wafer simultaneously is, approximately 1.6 W. This is easily achievable with multi-mode NdYAG lasers.

The advantage of this system, as described above, is that the radiation is absorbed by the workpiece 12 independently of its temperature. While the incident radiation may be in the ultraviolet, infrared, visible, radio frequency or X-ray spectrums, a preferred embodiment employs infrared radiation.

The present invention is not limited to a silicon workpiece, but as described above is also suitable e.g. for use with a quartz reticle substrate, the only difference being the selection of a suitable frequency of the incident radiation.

In the system of FIG. 1, the radiation is applied through a transmissive portion of the support 10 so as to have the capability to heat a workpiece which has already been partially processed, i.e., may have for instance CAR applied to its front (upper) surface. Since the radiation is applied to the rear "naked" wafer surface, it is more efficiently absorbed. In other cases where the wafer being heated is an unprocessed wafer, the radiation may be applied from the front side and hence there is no need for a transmissive portion of the support. In the case of a wafer coated with a CAR, conceivably one may desire to heat from both top and bottom, the radiation spectral properties of the top source being determined by the CAR properties, and those of the bottom by silicon. Where one desires to heat an already partly processed wafer from the front side, it is possible by experimentation to determine a suitable wavelength for efficiently heating the wafer through the front side layers, so long as these layers are transmissive of certain wavelengths. Of course the present heating system is not likely to be used for a fully metallized (i.e., front and back) wafer. In another embodiment, radiation source 16 may be tuneable, i.e. be an adjustable wavelength radiation source.

In addition to quartz or silicon, the workpiece may be other materials such as gallium arsenide, which as is well known, requires precise temperature control in a vacuum environment for processing. In addition, while a quartz workpiece-has been utilized in one embodiment, ULE (ultra-low expansion) glass, or other materials having a very small thermal expansion coefficient and suitable optical properties can be substituted for quartz.

Also, it is to be understood that the apparatus of FIG. 1 may be a stand alone heating apparatus or a part of semiconductor processing equipment having other functions.

The following is directed to determining a suitable wavelength for the radiation incident upon the workpiece. As described above, this determination may be made on the basis of theoretical calculations as described here, or alternatively by experimentation.

As is well known, the fraction of incident light absorbed passing through a material of thickness x is equal to $(1-R) \cdot (1-e^{-\alpha x})$, where R is the fraction of reflected light from the surface of the material (the reflection coefficient) and $\alpha$ is the absorption coefficient of the material.

Figure 2A:
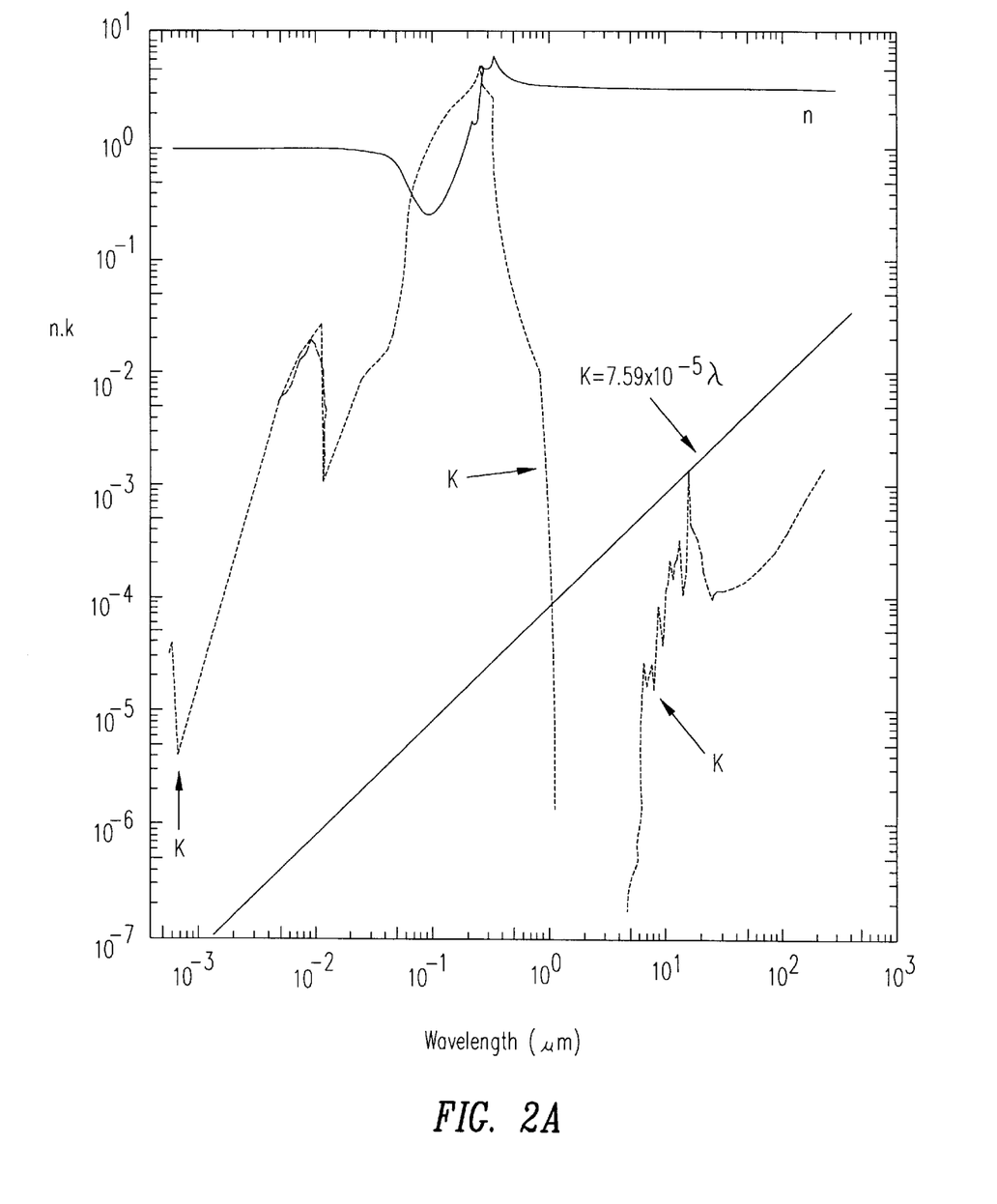
FIG. 2a shows a plot of index of refraction and extinction coefficient vs. wavelengths for silicon.

As is also known, $\alpha = 4\pi k/\lambda$ where $\lambda$ is the wavelength of the incident radiation and k is the extinction coefficient of the material for a particular wavelength. Thus FIG. 2a shows a log—log plot of both the index of refraction (n) and extinction coefficient (k) (along the vertical axis) vs. wavelength in micrometers (along horizontal axis) for monocrystalline crystal silicon as the material. For normally incident light $R=((n-1)^2+k^2)/((n+1)^2+k^2)$.

Suppose that the desired efficiency is 50%, i.e., ½ of the radiation passing through a silicon wafer is to be absorbed by it. In this case, ignoring the reflectivity factor R, $½=1-e^{-\alpha x}$. Thus $\alpha=(1/x) \ln 2 = 0.693/x$. Thus $k=\alpha\lambda/4\pi=0.693\lambda/4\pi x=0.055\lambda/x$. For a typical 8 inch diameter silicon wafer, its thickness x is 725 micrometers, hence $k=7.59\times10^{-5}\lambda$ ($\lambda$ being in micrometers). With reference to FIG. 2, it can be seen that for a wavelength $\lambda$ of 1 micrometer, k is equal to approximately $8\times10^{-5}$. Note that between approximately 1.1 micrometers and 8 micrometers, silicon is transparent to the radiation i.e., k is very small. Hence over the relevant transmission bands, the desired 50% efficiency condition is met for radiation wavelengths of approximately 1.0–1.1 micrometers at the conduction band edge and, just barely, at around 10 micrometers in the lattice band. For higher levels of absorption in the wafer wavelengths below about 1.1 micrometer are effective.

Figure 2B:
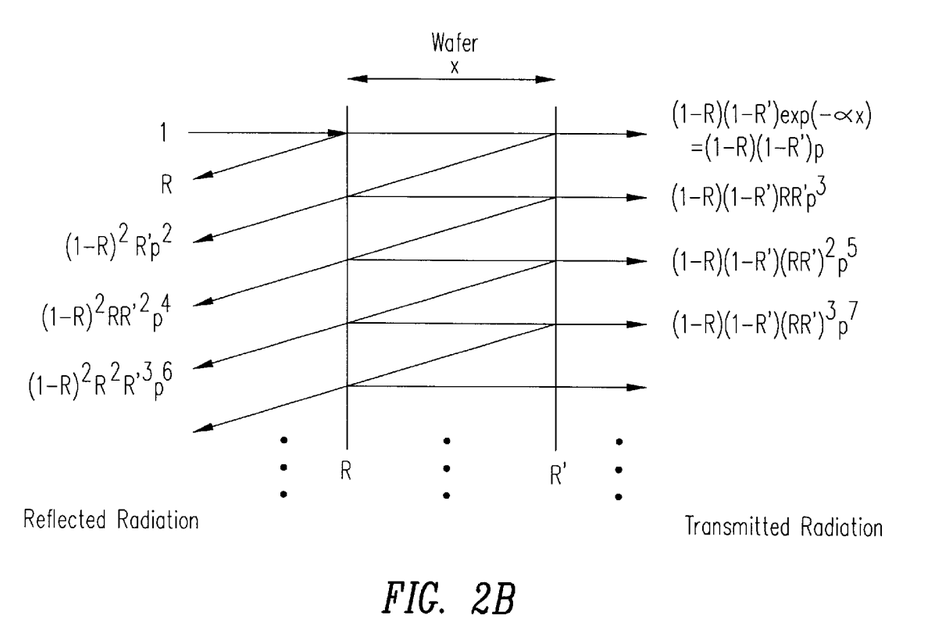
FIG. 2b shows the reflection, absorption, and transmission of radiation incident on the wafer.

This analysis is only approximate. For example, it neglects the additional radiation absorbed in the silicon during multiple reflections of the light within the wafer. This is illustrated in FIG. 2b. The reflectivity R' of the light from the top surface of the wafer will generally be different from R because of the thin films deposited on the surface. The light is multiply reflected between the top and bottom surfaces; at each surface some of the light escapes. Meanwhile the light is being steadily absorbed within the wafer. If we define $p=e^{-\alpha x}$, the attenuation of the light during one pass through the wafer, the total amount of light reflected from the wafer $R_{tot}$ and the total amount of light transmitted through the wafer $T_{tot}$, are given approximately by $$R_{tot}=R+(1-R)^2 R'p^2\{1+RR'p^2+(RR')^2p^4+\ldots\}=R+(1-R)^2R'p^2/[1-RR'p^2];$$

$$T_{tot}=(1-R)(1-R')p\{1+RR'p^2+(RR')^2p^4+\ldots\}=(1-R)(1-R')p/[1-RR'p^2].$$

The total amount of light absorbed in the wafer is then $$A_{tot}=1-R_{tot}-T_{tot}=1-\{R+R'p^2(1-2R)-(1-R)(1-R')p\}/[1-RR'p^2].$$

This calculation is for the intensity, not the amplitude of light as would normally be the case for multiple reflection calculations. It was assumed that the laser light in the wafer is sufficiently incoherent so that this approximation holds. If the laser light were highly coherent this expression would not be correct, and interference effects like speckle might reduce the uniformity of the illumination. The coherence can be reduced by e.g. passing the laser beam through a moving diffuser plate, or by using a laser with several independently lasing wavelengths. Furthermore, as the laser beam passes through the wafer substrate and then the wafer, the beam's coherence is reduced. If the mean laser wavelength is $\lambda$ and the bandwidth is $\Delta\lambda$, and if the beam passes through a material with index of refraction n, then the coherence of the laser is essentially destroyed in a distance d, the coherence length, where $$d \approx \lambda^2/(2\pi n \Delta\lambda).$$

(See M. Born and E. Wolf, *Principles of Optics*).

The quantities p, R, and R' all depend on the wavelength of the light. The quantities p, $A_{tot}$, and R (see legend on FIG. 2c) are plotted in FIG. 2c as a function of $\lambda$ (horizontal axis). For the case of the NdYAG laser, $\lambda=1.064$ µm, p≈0.5 and R≈0.315. Assume for simplicity that R'≈1.0. Then the total fraction of incident light absorbed in the wafer is given by $$A_{tot} \approx (1-R)0.81 \approx 0.55/$$

Figure 2C:
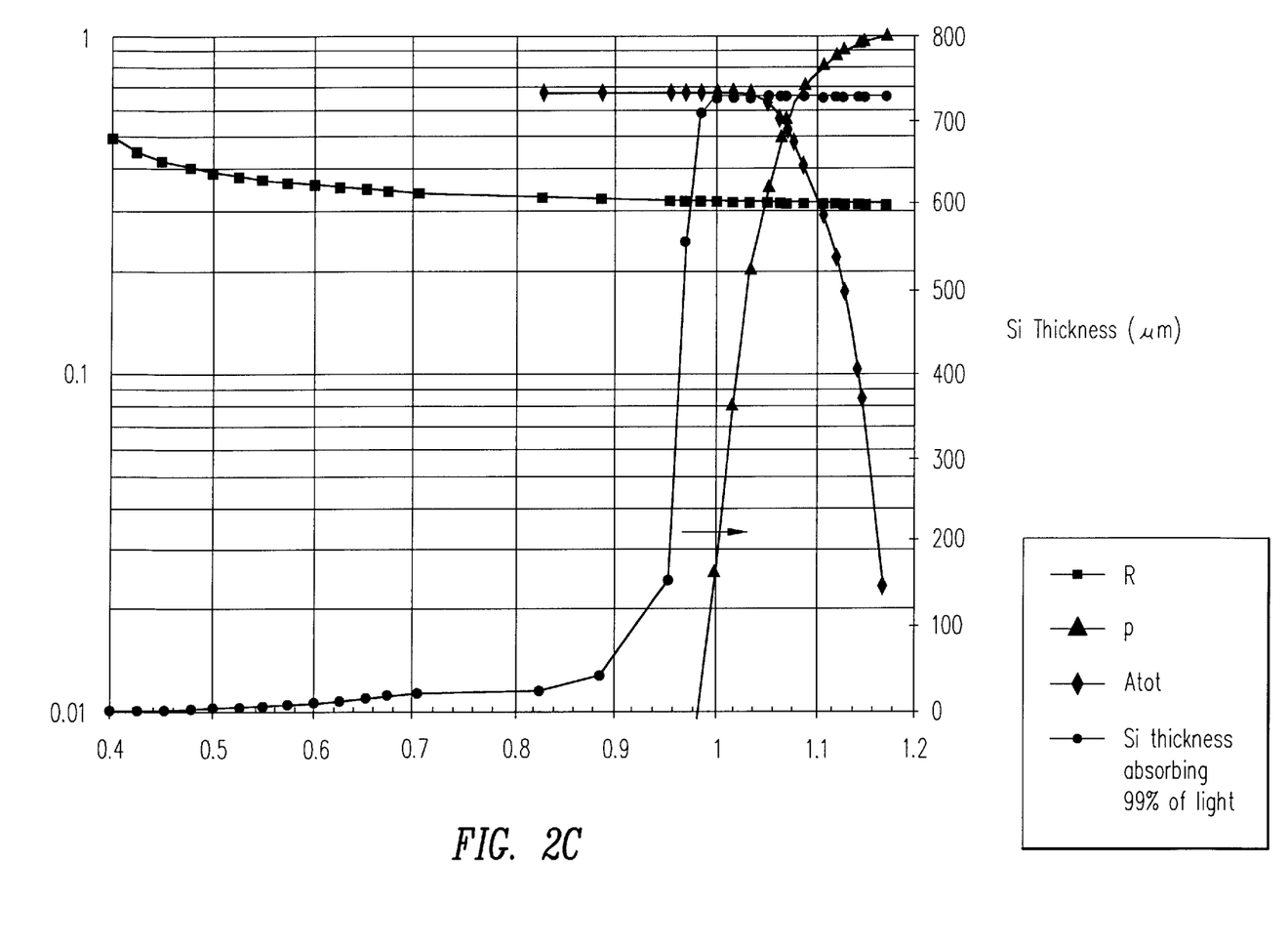
FIG. 2c shows a plot of the absorptive and reflective properties of silicon over a range of wavelengths.

So over 80% of the light entering the wafer is absorbed fairly uniformly within it, and 55% of the incident light is absorbed. Note that at visible wavelengths R is significantly higher, R≈0.485–0.355 over the range $\lambda=0.4-0.6$ µm, so less light enters the wafer.

FIG. 2c also shows the distance the light travels in the wafer before 99% of the intensity is absorbed. Although the absorbance of the wafer is very high at wavelengths less than about 1 μm, essentially all of the light is absorbed within a few μm of the front surface, so the absorption is far from uniform. This condition more resembles the case of conduction. The infrared radiation situation clearly allows more uniform energy deposition in the wafer.

Of course this is merely an example of how to select the proper wavelength. Clearly the value of R' will affect the exact wavelength as bandwidth determination, and other efficiency factors are possible, either higher or lower, and of course other parameters will differ for other materials and for other thicknesses of material. Moreover, the exact bandwidth is of less importance so long as it is relatively narrow, to keep the majority of the radiation within the bandwidth which will be efficiently absorbed.

The fact that the optimal range of wavelengths for efficient heating of silicon includes the wavelength of the NdYAG laser has another implication. Should it be desired to use a broadband light source with a filter, instead of the laser, efficient narrow band filters are readily available for that wavelength. For example, Oriel Corp. supplies a filter with a central wavelength of 1.064 μm and a bandwidth of 5±1 nm.

Figure 3:
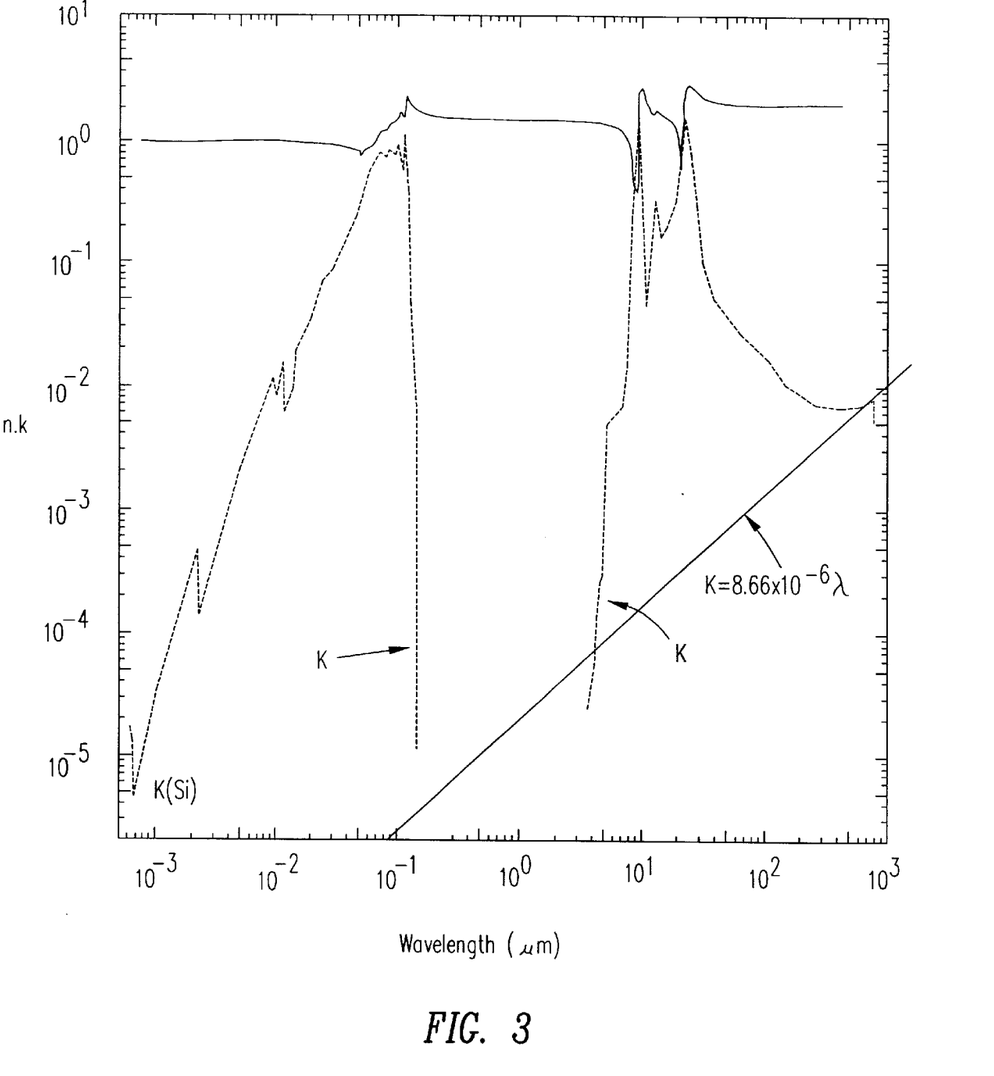
FIG. 3 shows a similar plot to that of FIG. 2a of index of refraction and extinction coefficient vs. wavelengths for quartz (silicon dioxide).

A similar analysis is performed for silicon dioxide (quartz or fused silica) using FIG. 3 which shows a log-log plot of index of refraction (n) and extinction value (k) (vertical axis) vs. wavelength in micrometers along the horizontal axis. FIG. 3 shows that absorption for a quartz plate of thickness 0.25", comparable to that of a reticle blank for lithography. Heating would be efficient at a central wavelength of about 3.8–4 micrometers and a bandwidth of several hundred nm.

The light source could be a broadband source with a filter. It could also be a deuterium fluoride (DF) laser which lases at a number of wavelengths in the range 3.6–4.0 μm. Both sources have some drawbacks. Conventional gas discharge lamps are enclosed in quartz envelopes, which absorb the radiation at exactly the wavelengths of interest here. Some radiation of those wavelengths does escape through the envelope, but the radiation intensity is not very high. The envelope could be replaced by an IR transparent type of quartz, referred to as IRTRAN, but such lamps do not appear to be commercially available. For the case of heating in vacuum, a filament could be heated without a quartz envelope. A blackbody radiating at approximately 3000° K. would provide more than adequate intensity. The DF lasers can provide quite high power levels, but there is some danger associated with the use of $F_2$ gas which is highly corrosive.

Using the same argument as for the silicon wafer, the time required to raise the plate temperature can be estimated, give $c_p$=0.7411 J/g-°C., p=2.202 g/cm$^3$, and a thickness of t=0.25"=0.635 cm, for fused silica. Assuming again that all the incident radiation is absorbed (f=1.0) and I=5 mW/cm$^2$, the time required to raise the plate temperature 1° C. is 207 sec. This represents a very attractive condition for quartz reticles which typically require much longer heating times, or very carefully controlled thermal environments.

Note that quartz is transparent between approximately $10^{-1}$ micrometers and 3.5 micrometers. Thus quartz would be a suitable substrate for a silicon wafer. Given the low thermal conductivity of quartz, the present radiative heating method is a far more efficient method for heating quartz than are conventional methods.. of course, if the workpiece is quartz, the support must have a transmissive portion of a material which will transmit (in the apparatus of FIG. 1) the incident radiation. In this case , for instance, a number of materials are transparent at λ≈4 μm including germanium, silicon, and IRTRAN quartz.

As se en above, a fraction R of the incident radiation is reflected from t he wafer or reticle, representing a loss of efficiency. Similar losses will al so occur at the supporting substrate. However, the latter losses can be avoided by applying antireflection coatings to the substrate surfaces. Such coatings are more effective at a prescribed wavelength, which would be chosen to be equal to that of the incident radiation.

Therefore it is understood that this description of selection of suitable wavelengths for silicon and quartz is merely exemplary, and it is within the skill of one of ordinary skill in the art to apply this method and the associated apparatus to heating other materials and materials of varying thickness.

Since this method offers uniformity of absorption of heat by the workpiece, uniformity of the workpiece temperature will be limited primarily by the uniformity of the intensity of the radiation incident on the workpiece. This can be controlled by optical systems to improve the source intensity uniformity at the workpiece, or moving the structure to average out intensity non-uniformities. In one embodiment, as shown, the incident radiation is perpendicular to the irradiated surface of the workpiece. The reflection of the incident radiation is as usual a function of the incidence angle and is at a minimum at a normal (90°) incidence angle.

While the above-described determination, through theoretical calculation, of the wavelength of the incident radiation for a quartz workpiece having a particular thickness provides a reasonable approximation of the appropriate wavelength, an optimal wavelength determination is made in a semi-empirical fashion. That is, other parameters of the system which are not as critical, i.e. the distance between the radiation source and the workpiece, or the total power output by the radiation source, may be optimized, or used to adjust the calculated optimal wavelength, as will be understood by one of ordinary skill in the art, to help maximize heating efficiency.

This disclosure is illustrative and not limiting; further modifications will be apparent to one skilled in the art in light of this disclosure and are intended to fall within the scope of the appended claims.

I claim:

1. A method for heating a workpiece, comprising:

determining wavelengths of radiation efficiently absorbed by the workpiece, as a function of a thickness of the workpiece and its extinction coefficient; and irradiating the workpiece with radiation limited to a bandwidth of wavelengths determined to be efficiently absorbed by the workpiece, wherein the workpiece is a silicon crystal wafer and the radiation bandwidth incident on the workpiece is less than 10 nm and having a central wavelength of approximately 1 μm.

2. A method for heating a workpiece, comprising:

determining wavelengths of radiation efficiently absorbed by the workpiece, as a function of a thickness of the workpiece and its extinction coefficient; and irradiating the workpiece with radiation limited to a bandwidth of wavelengths determined to be efficiently absorbed by the workpiece; wherein the bandwidth is such that at least one-half of the radiation incident on the workpiece which is not reflected therefrom is absorbed by the workpiece.

3. The method of claim 2, wherein the workpiece is a silicon crystal wafer.

4. The method of claim 2, wherein the workpiece is a quartz substrate.

5. The method of claim 1, further comprising:

sensing a temperature of the workpiece; and altering a level, of the radiation in accordance with the sensed temperature, thereby to control the temperature of the workpiece.

6. A method for heating a workpiece, comprising:

determining wavelengths of radiation efficiently absorbed by the workpiece, as a function of a thickness of the workpiece and its extinction coefficient;

placing the workpiece on a support having a portion transmissive of the radiation; and irradiating the workpiece with radiation limited to a bandwidth of wavelengths determined to be efficiently absorbed by the workpiece by directing the radiation through the support to the workpiece.

7. A method for heating a workpiece, comprising:

determining wavelengths of radiation efficiently absorbed by the workpiece, as a function of a thickness of the workpiece and its extinction coefficient;

irradiating the workpiece with radiation limited to a bandwidth of wavelengths determined to be efficiently absorbed by the workpiece; and further comprising forming an anti-reflective coating on the workpiece.

8. The method of claim 1, wherein the workpiece is at least partially coated with a second material, and wherein the determining comprises determining by experiment.

9. The method of claim 1, wherein irradiating the workpiece takes place in a vacuum.

10. An apparatus for heating a silicon crystal wafer workpiece, comprising:

a support for holding the workpiece; and a radiation source spaced apart from the support and located to direct radiation onto the workpiece on the support, the radiation being limited to a bandwidth of less than 10 nm and having a central wavelength of approximately 1 $\mu$m.

11. An apparatus for heating a workpiece, comprising:

a support for holding the workpiece; and a radiation source spaced apart from the support and located to direct radiation onto the workpiece on the support, the radiation being limited to a bandwidth of wavelengths efficiently absorbed by a particular workpiece; wherein the support includes a portion transmissive of the radiation, and wherein the radiation source is located on a side of the support remote from the workpiece.

12. The apparatus of claim 10, further comprising a vacuum chamber surrounding the support.

13. The apparatus of claim 10, wherein the radiation source includes a broadband source and a bandpass filter.

14. An apparatus for heating a workpiece, comprising:

a support for holding the workpiece; and a radiation source spaced apart from the support and located to direct radiation onto the workpiece on the support, the radiation being limited to a bandwidth of wavelengths efficiently absorbed by a particular workpiece; wherein the support is of a material transmissive of the radiation and the radiation is directed through the support.

15. The apparatus of claim 14, wherein the support is a mesh.

* * * * *

UNITED STATES PATENT AND TRADEMARK OFFICE
CERTIFICATE OF CORRECTION

PATENT NO. : 5,954,982
DATED : September 21, 1999
INVENTOR(S) : Michael R. Sogard It is certified that error appears in the above-identified patent and that said Letters Patent is hereby corrected as shown below:

Column 1,
Line 66, delete "-";

Column 8,
Line 1, delete "se en" and substitute -- seen --;
Line 2, delete "t he" and substitute -- the --; and
Line 3, delete "al so" and substitute -- also --.

Signed and Sealed this

Nineteenth Day of March, 2002

Attest:

JAMES E. ROGAN
Director of the United States Patent and Trademark Office

Attesting Officer